United States Patent [19]
Ekelund et al.

[11] Patent Number: 5,381,296
[45] Date of Patent: Jan. 10, 1995

[54] SHORT CIRCUIT LIMITING PROTECTOR

[75] Inventors: Folke Ekelund, Norsborg; Leif Hansson, Rönninge, both of Sweden

[73] Assignee: Telefonaktiebolaget L M Ericsson, Stockholm, Sweden

[21] Appl. No.: 151,819

[22] Filed: Nov. 15, 1993

[30] Foreign Application Priority Data

Nov. 16, 1992 [SE] Sweden ........................... 9203432

[51] Int. Cl.6 ............................................ H02H 5/04
[52] U.S. Cl. .................................. 361/106; 361/58; 361/86
[58] Field of Search ............... 361/58, 106, 42, 86, 361/87

[56] References Cited

U.S. PATENT DOCUMENTS

| | | | |
|---|---|---|---|
| 3,697,863 | 10/1972 | Kilmer | 361/106 |
| 3,935,511 | 1/1976 | Boulanger | 361/106 |
| 4,531,083 | 7/1985 | Hoffman | 320/9 |
| 4,531,084 | 7/1985 | Hoffman | 320/39 |

FOREIGN PATENT DOCUMENTS 2533182 1/1977 Germany.

OTHER PUBLICATIONS

Patent Abstract of Japan, vol. 13, No. 323, JP 1-89914 (Apr. 5, 1989).

Primary Examiner—Todd E. DeBoer
Attorney, Agent, or Firm—Burns, Doane, Swecker & Mathis

[57] ABSTRACT

A current limiting short-circuiting protector is disclosed which utilizes an electronic and thermal feedback principle for achieving precise and rapid release of the protector, which can be readily reset. The principle utilizes a non-linear powerful temperature-dependent resistor in the collector circuit of a field effect transistor which serves as a current valve and through which the total current to be monitored is passed. The circuit replaces a conventional fuse and may also function as a load on/off control means. When a fault occurs in the load, the erroneous current is limited to a much lower value than is the case with a conventional fuse.

6 Claims, 5 Drawing Sheets

SHORT CIRCUIT LIMITING PROTECTOR

TECHNICAL FIELD

The present invention relates to a shortcircuit limiting protector, and more specifically to an electronic fuse which has minimal power losses under normal operating conditions and which will be triggered rapidly and reliably at a predetermined current level.

BACKGROUND ART

There is found in different electronic circuits and units for supplying working voltages to such circuits a need for safety devices in the form of fuses which will trigger when the current in the circuit protected by the fuse becomes excessively high, for instance due to a short-circuit.

The most common type of fuse is the thermal fuse which normally consists of a glass tube which contains a thin filament or wire which melts or burns when a given current passes through the filament, because the product of filament resistance and current generates heat which, when the current is excessive, melts the filament.

A fuse of this kind will function satisfactorily in the event of a complete short-circuit, whereupon the fuse is triggered relatively quickly. In the event of a short-circuit, the fuse permits a high short-circuit current to pass through which is limited solely by the impedance of the supply source. Such high short-circuiting currents are liable to damage conductors, electric contacts and other electronic devices, and may disturb parallel-supplied electronic devices. On the other hand, if the current is high and lies close to or immediately above the rated value of the fuse, it may take considerable time for the fuse to trigger, which in some cases can cause considerable problems due to the overloading of other circuit components. Furthermore, a fuse of this kind can be made either slow or quick. Furthermore, when subjected to loads that are close to its rated value, a fuse of this kind may undergo changes caused by aging, such that after a longer installation period the fuse may trigger without the original rated value of the fuse being exceeded.

Presently voltage supply units often have some form of current limitation which permits maximum power to be taken-out by a circuit. This is often achieved by allowing the current to obtain a given maximum value and then reducing the voltage so that the current will never exceed the current limiting value. When the voltage is reduced, this may render the function of many circuits unsafe because a voltage level becomes critical, which may jeopardize the application as a whole.

In order to overcome this drawback, it is necessary to monitor voltage in addition to monitoring current, so that the current supply will be broken and a fault indicated when the voltage falls beneath a predetermined value. This results in a particularly complex safety system, which may be more comprehensive than the detail to be monitored or supervised. This is a problem, for instance, in equipment which serves many users and where there is a natural desire that a fault that occurs in respect to one user will not interfere with the other users. An example of this type application is found in a telephone network. For instance, if a subscriber suffers a fault, the fault must in no way influence any of the remaining, possibly hundreds of thousands of subscribers. It is important in applications of this nature that the current can be monitored in the simplest but most effective manner, so as to keep installation costs at a reasonable level. Many similar applications are found within the fields of electronics and data technology where an overload protector is desirable and which is rapid and precise without the protector generating radio disturbances and being too complicated. Another desire is that a protector of this kind need not necessarily be replaced with a new component, but can be readily re-set, either manually or automatically, after eliminating the source of the fault.

U.S. Pat. No. 4,531,083 and U.S. Pat. No. 4,531,084 teach a current regulating circuit for a direct-current mains unit which is intended to charge rechargeable batteries without the use of transformers, capacitors, or coils. The emitters of a first and a second transistor are connected via a fifth current limiting PTC-resistor which is able to function as a fuse. Instead of using a plurality of transistors in a Darlington circuit, MOS field effect transistors can be used. The PTC-resistor is intended to operate at a nominal temperature of 125° C. during a battery charging process, wherein the charging current will decrease by 0.45% with each degree of increased working temperature for this resistor. The resistor is also preferably obtained by metallizing with a material which will enable the resistor to function as a fuse.

German Patent No. 2,533,182 teaches a circuit arrangement for indicating a triggered or blown fuse in a current supply arrangement, wherein an optoswitch is used to indicate to a display device that its fuse has been triggered.

There is thus a need to provide a current limiting device which is both rapid and precise, and in which the power generated under normal operating conditions will be very small.

Disclosure of the Invention

Accordingly, it is an object of the present invention to provide a short-circuit limiting protector which will fulfill the following specifications:
a) will be triggered quickly and immediately at a chosen current value;
b) will have minimum power losses at normal current values;
c) will have a non-linear characteristic at triggering currents, so that triggering of the device will be accelerated;
d) that the short-circuiting current will be limited to a desired level, irrespective of the internal impedance of the supply source;
e) that the device will not generate radio frequency disturbances in operation; and
f) when breaking erroneous currents, the device will limit the induced overvoltage to a predetermined value.

In accordance with the present invention, there is provided a device according to the above specifications which when triggered can be easily reset, after establishing and eliminating the cause of the current surge.

In accordance with the present invention, there is also provided a short-circuit limiting device which utilizes a combined electronic and thermal feedback principle.

The present invention also provides a device which when nominal or rated current is reached exhibits a carefully established delay and is quickly triggered, or "blown", immediately after this delay has lapsed. Thus, in the event of a fault in the load, the erroneous current is limited to a much lower value than is a conventional fuse.

In accordance with the present invention, there is also provided a device according to the above specifications which can be reset automatically or manually and which can also be set to an inactive state without needing to remove the device.

BRIEF DESCRIPTION OF THE DRAWINGS

The present invention will now be described with reference to a number of exemplifying embodiments thereof and also with reference to the accompanying drawings, in which.

DESCRIPTION OF EXEMPLIFYING EMBODIMENTS

Figure 1:
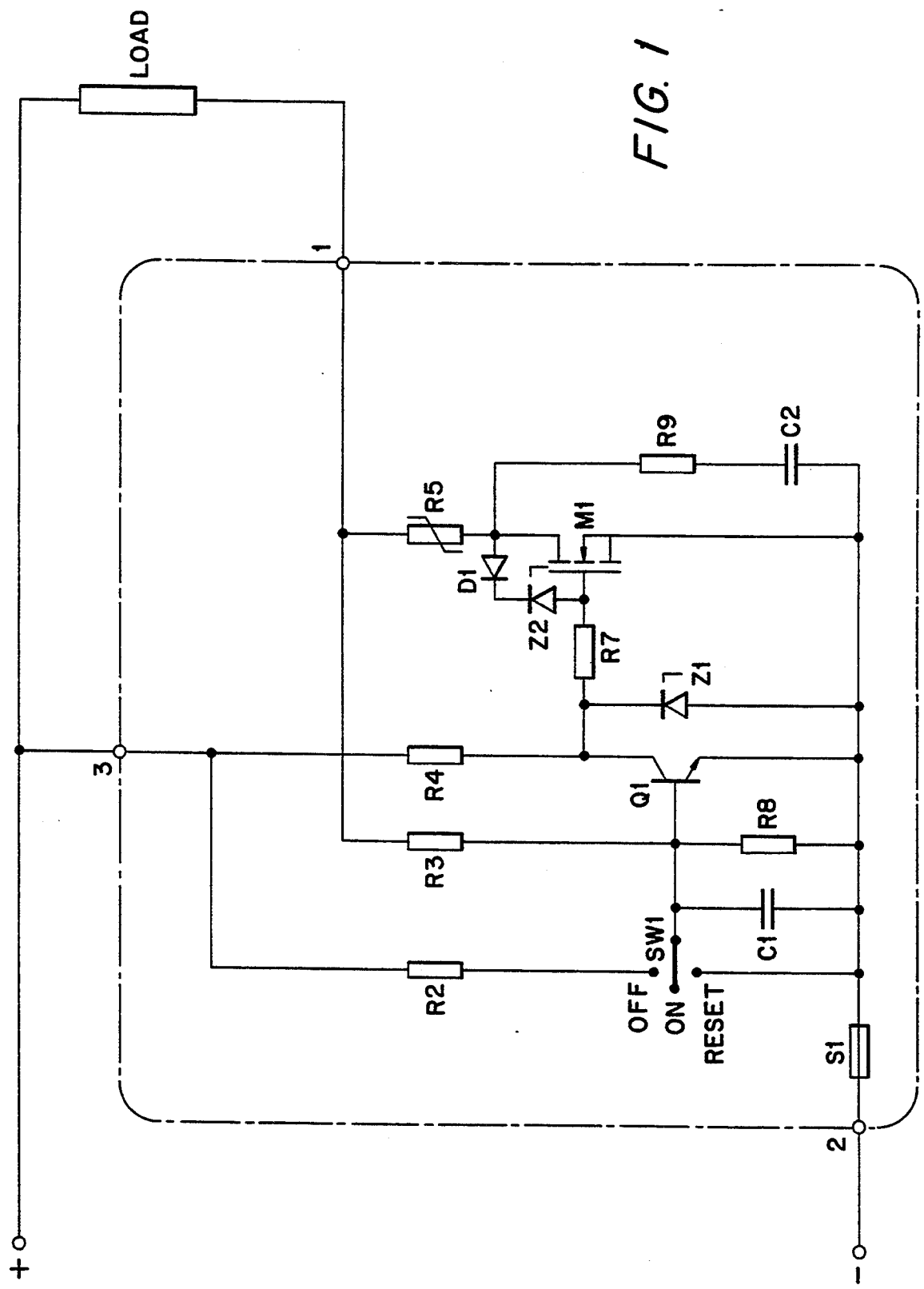
FIG. 1 is a circuit diagram of a basic illustrative embodiment of an inventive short-circuit limiting device.

FIG. 1 is a circuit diagram which illustrates by way of example a circuit which utilizes an electronic and thermal feedback principle in accordance with the present invention. The circuit diagram includes a number of resistors R2, R3, R4, R7, R8, R9 and a non-linear temperature-dependent resistor R5. The circuit also includes a field effect transistor M1 in series with the non-linear temperature-dependent resistor R5, and a silicon diode D1 and two zener diodes Z1, Z2, and a bipolar NPN-transistor Q1 and two capacitors C1 and C2. According to the present invention, the main functional part of the illustrated circuit is comprised generally of the components M1, R5, Q1, R4, R3 and R8. In the case of the illustrative embodiment, the resistor R5 is a PTC-resistor of the type RUE 800 produced by Raychen Pontaisc SA, France. The field effect transistor M1 is a power MOSFET, for instance of the type MTW 45N10E produced by Motorola, and the transistor Q1 is, for instance, a BC 847B transistor produced by Motorola, for instance. Remaining resistors, capacitors and diodes are comprised of generally available standard components. The zener rated voltage of the zener diode Z1 is 12 volts, while the zener diode Z2 has a rated voltage of 90 volts.

The reference SW1 identifies a switch which has three positions, OFF, ON and RESET. When the switch is in the OFF position, sufficient potential is applied via the resistor R2 for the transistor Q1 to conduct, therewith blocking the field effect transistor M1, which consequently allows no current to pass through. In other words, the load L is disconnected.

If the switch SW1 is briefly switched to the RESET position, Q1 is activated and the voltage on the gate of M1 will rapidly increase to the level determined by the zener diode Z1 and the voltage divider consisting of resistors R4 and R7, where R4 is connected to the positive terminal of the voltage source that supplies the load L. The field effect transistor M1 will then conduct current and the load L is thus activated. The gate on M1 thus obtains a potential at which it is fully conducting, wherewith the voltage drop across M1 in the case of moderate currents will be practically negligible (one or some tenths of a volt). When the switch SW1 is then left in its neutral position, i.e., its ON position, the circuit will operate in its operational mode.

The non-linear temperature-dependent resistor R5 is connected in series with the thus created circuit, at the collector connection of the transistor M1. The resistance of R5 is small at normal working temperatures, in the same order of magnitude as the input or ON-resistance of M1. The two components M1 and R5 of the preferred embodiment are mounted so that when operating at normal current, thermal equilibrium is obtained between the dissipated power generated and the heating power cooled-off from M1 and R5. These components are mounted in good thermal contact with the component carrying board (fiberglass board, ceramic substrate or a metal board, provided that the components are insulated from the board). The non-linear temperature-dependent resistor is also conveniently mounted so as to be also influenced by the thermal energy developed by the transistor M1. In the case of an embodiment which includes discrete, encapsulated components, the transistor M1 is appropriately provided with a cooling fin. The circuit created in series with the load L and the positive and negative terminal connection of the voltage source therewith operates in its operational mode when the switch SW1 is in its ON position, so as to monitor the state of the circuit in readiness to immediately break the circuit of the load L at a predetermined overcurrent.

The following occurs when the current through the load L exceeds the chosen overcurrent release value. The temperature of both M1 and R5 will increase markedly, wherein the increasing temperature of R5 will cause the its resistance to increase rapidly, in an accelerating fashion (non-linear dependency). The rapidly increasing resistance in R5, and to some extent also in M1, together with the abnormal current will result in an increasing voltage drop over R5 in series with M1. As a result of the action of a first voltage divider consisting of the load L and the combination of M1 and R5, the voltage across a second voltage divider consisting of the resistors R3 and R8 supplying the transistor Q1 increases. When the potential at the point between the resistors R3 and R8 which supply the base electrode on the transistor Q1 exceeds a given threshold value, Q1 becomes conducting, which in a typical case occurs in a very short time, in the order of microseconds, and therewith short-circuits the zener diode S1 and the transistor M1 switches to a non-conducting state and the current through the load L is broken.

After breaking the current through the load L, the whole of the supply voltage lies over the second voltage divider consisting of resistors R3 and R8, and Q1 is consequently supplied with sufficient base current to be fully conducting and therewith holds M1 in a blocked, non-conducting state.

When a short-circuit occurs in the load L, the short-circuiting current will increase rapidly and therewith also the voltage drop over M1 and R5. A release or turn-off sequence is initiated when the threshold level of the base-emitter voltage for Q1 is exceeded. A desired time delay between the time of the non-system current (the occurrence of the short-circuit) and the release of M1 is obtained by suitable selection of the value of the capacitor C1. The peak current through M1 is determined by the value of the capacitor C1 and by the inductance of the load L. If C1 is excluded, the peak current is determined partly by the base-emitter voltage for Q1 and partly by the quotient R3/R8.

If the transistor M1 is unable to break the short-circuiting current, R5 will limit the maximum current to a moderate value and then force the current down close to zero, by increasing its resistance very rapidly to several tens of thousands of ohms.

The fuse S1 is a typical, standard fuse which has a relatively high value and justified by the requirements placed on fuses by the authorities (the authorities do not accept the use of solely an electronic circuit as a short-circuiting protector), although the fuse S1 will never be tripped or triggered in reality.

When breaking an inductive load, the transient voltage is limited by the zener diode S2 in coaction with the field effect transistor M1. The release time is determined by the zener voltage and the amount of inductive energy that must be taken-up by M1. The diode D1 prevents current flowing through Z2 when M1 is fully conducting. R9 and C2 are constructed to attenuate oscillations when M1 is tripped (so-called snubber circuit).

Figure 2:
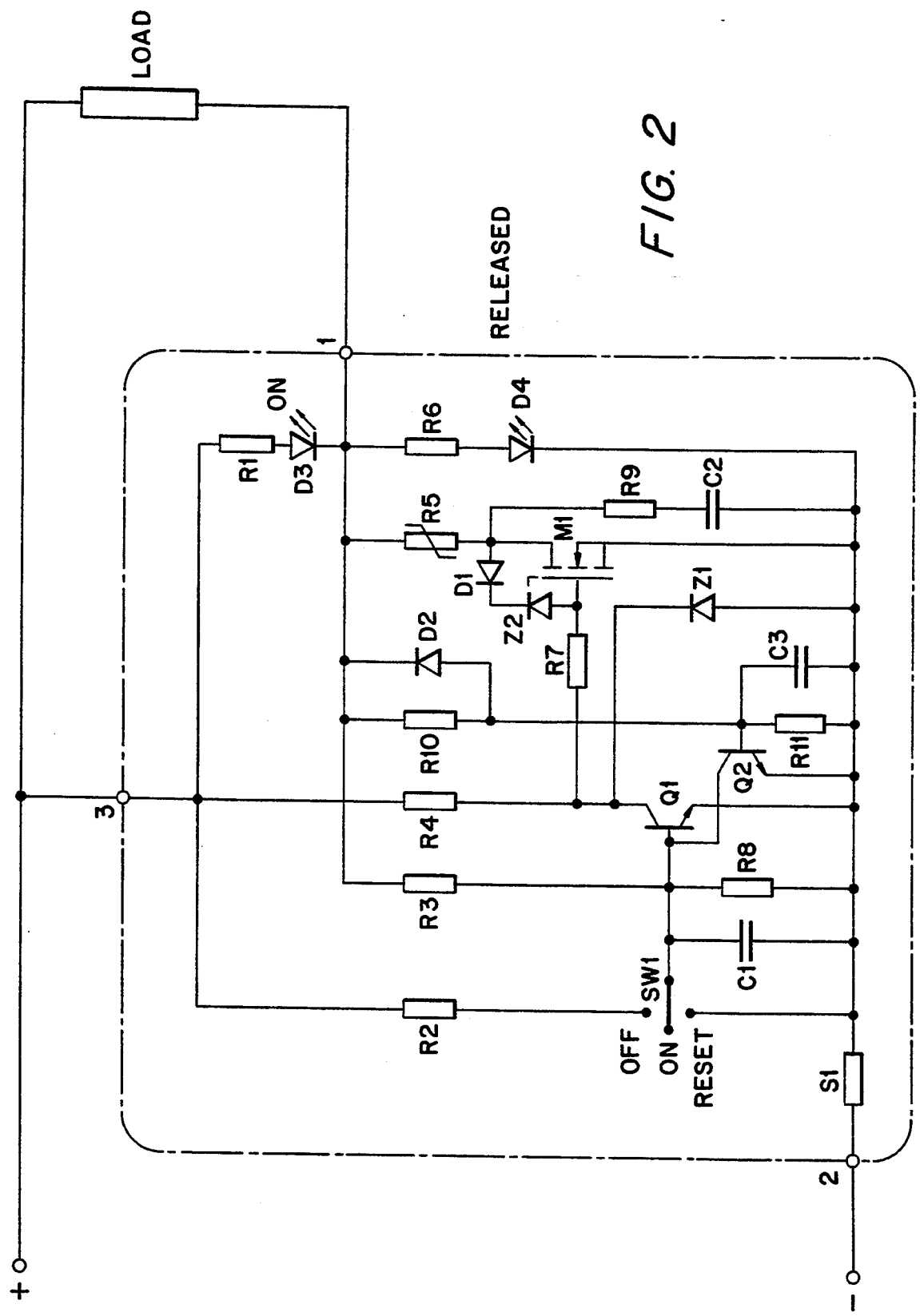
FIG. 2 is a circuit diagram of a second embodiment of an inventive short-circuit limiting device.

FIG. 2 illustrates another embodiment of the invention. In the FIG. 2 embodiment, the circuit illustrated in FIG. 1 has been supplemented with a further bipolar transistor Q2, for instance, of the type BC 847B with an associated third voltage divider consisting of the resistors R10 and R11, a capacitor C3 and a silicon diode D2.

The basic function of the circuit illustrated in FIG. 2 is the same as that of the circuit illustrated in FIG. 1, with the exception that the FIG. 2 circuit is reset automatically when a given period of time has lapsed after release. The transistor Q2 is connected in parallel with the resistor R8, between the base and emitter of the transistor Q1. The base electrode on Q2 is supplied through the resistors R10 and R11 of the third voltage divider. When the transistor M1 breaks the current through the load L and the voltage over the second voltage divider R3 and R8 is equal to the supply voltage, this voltage is also obtained over the third voltage divider. Charging of the capacitor C3 then commences via the resistor R10, to a voltage which corresponds to the dividing ratio of resistors R10 and R11. When the voltage on the base electrode exceeds the threshold voltage of Q2, after some period of time, Q2 begins to conduct and the transistor Q2 shunts-out the voltage level via the base electrode of the transistor Q1, which therewith ceases to be conducting. When the transistor Q1 becomes non-conducting, control voltage again appears on the gate of the field effect transistor M1, which then again switches to a fully conducting state and current can again flow through the load L. When M1 again becomes conducting, the voltage over the second and the third voltage dividers disappears. The diode D2 then causes the capacitor C3 to be quickly discharged, whereupon the device as a whole is again in its operational mode.

If the fault (the short-circuit) remains, the device again takes a blocking state after a given time lapse, the duration of which depends, among other things, on the time constants of the combinations R9 and C2, and R3, R8 and C1. The device will then break and make the current at a given repetition frequency which will depend on the time constants chosen in addition to the aforesaid combination of R10, R11 and C3.

The circuit illustrated in FIG. 2 includes two conventional light-emitting diodes D3 and D4 connected in series with a respective current limiting resistor R1 and R6. When supply voltage exists and the transistor M1 is conducting, the diode D3 will shine to indicate an ON-state. If the supply voltage remains but no current flows through the load L and sufficient voltage lies over the second (and third) voltage divider, the diode D4 will shine (radiate) indicating a triggering of the circuit. When the device in the FIG. 2 embodiment repeatedly breaks and makes the current circuit, the diodes D3 and D4 will flash alternately and therewith indicate this state. When the repetition frequency is sufficiently high, the eye of a viewer will experience the two diodes as radiating a marking which indicates a continued fault in the load L.

Figure 3:
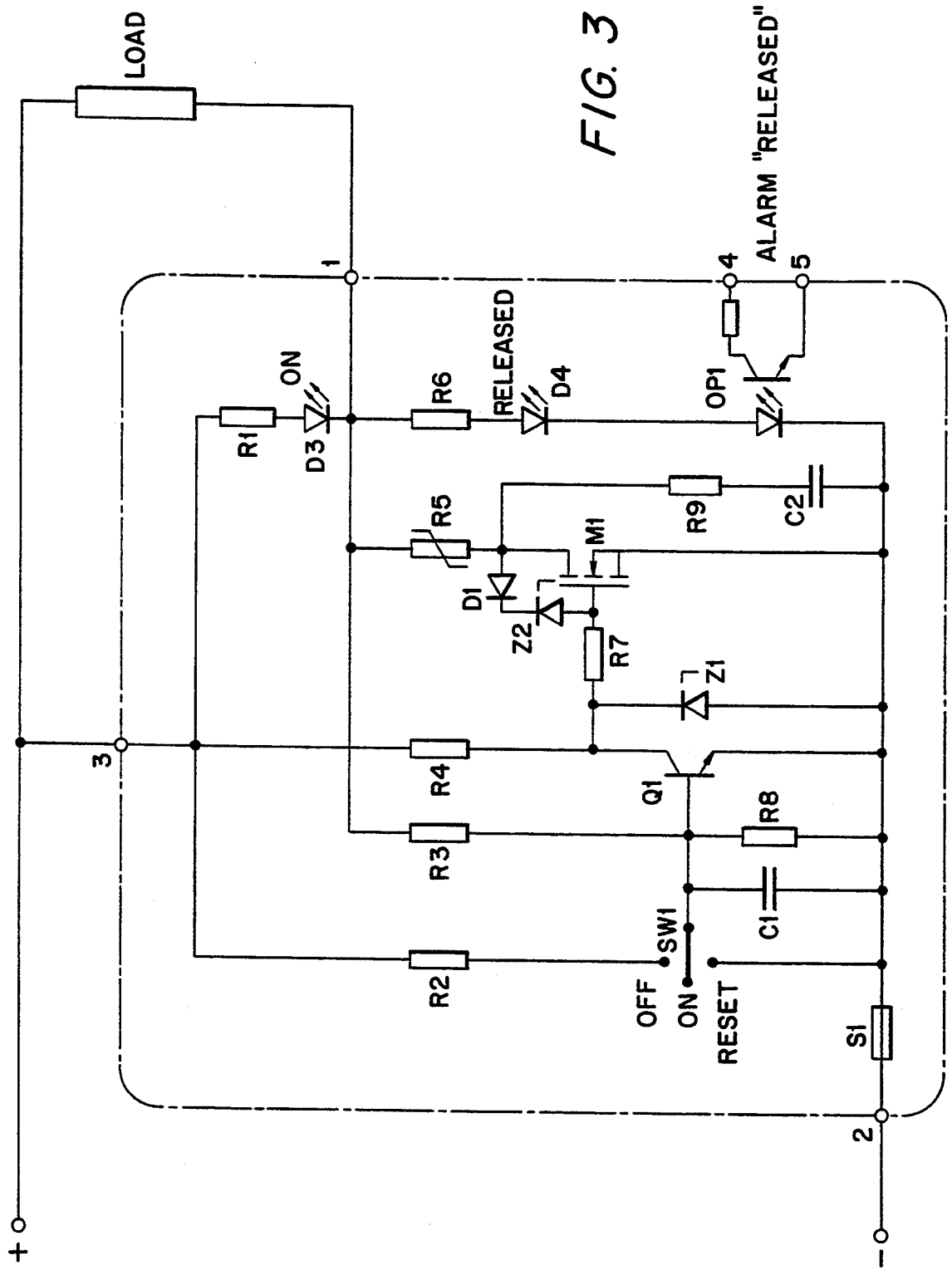
FIG. 3 is a circuit diagram of a third embodiment of an inventive short-circuit limiting device.

FIG. 3 illustrates a third embodiment of the present invention, in which the circuit shown in FIG. 1 is supplemented with the diodes D3 and D4 and also an optoswitch OP1, which in the case of the illustrative embodiment is of the type CNY 74-4 produced by Telefunken. In this case, the light-emitting diode D3 shows when voltage is applied to the circuit and M1 is conducting, while the light-emitting diode D4 shows that the circuit is triggered. The optoswitch OP1 lies in series with D4, and at the same time as D4 receives voltage and is ignited, the optoswitch OP1 receives the same current and is used to provide a remote indication that the circuit has been tripped.

Figure 4:
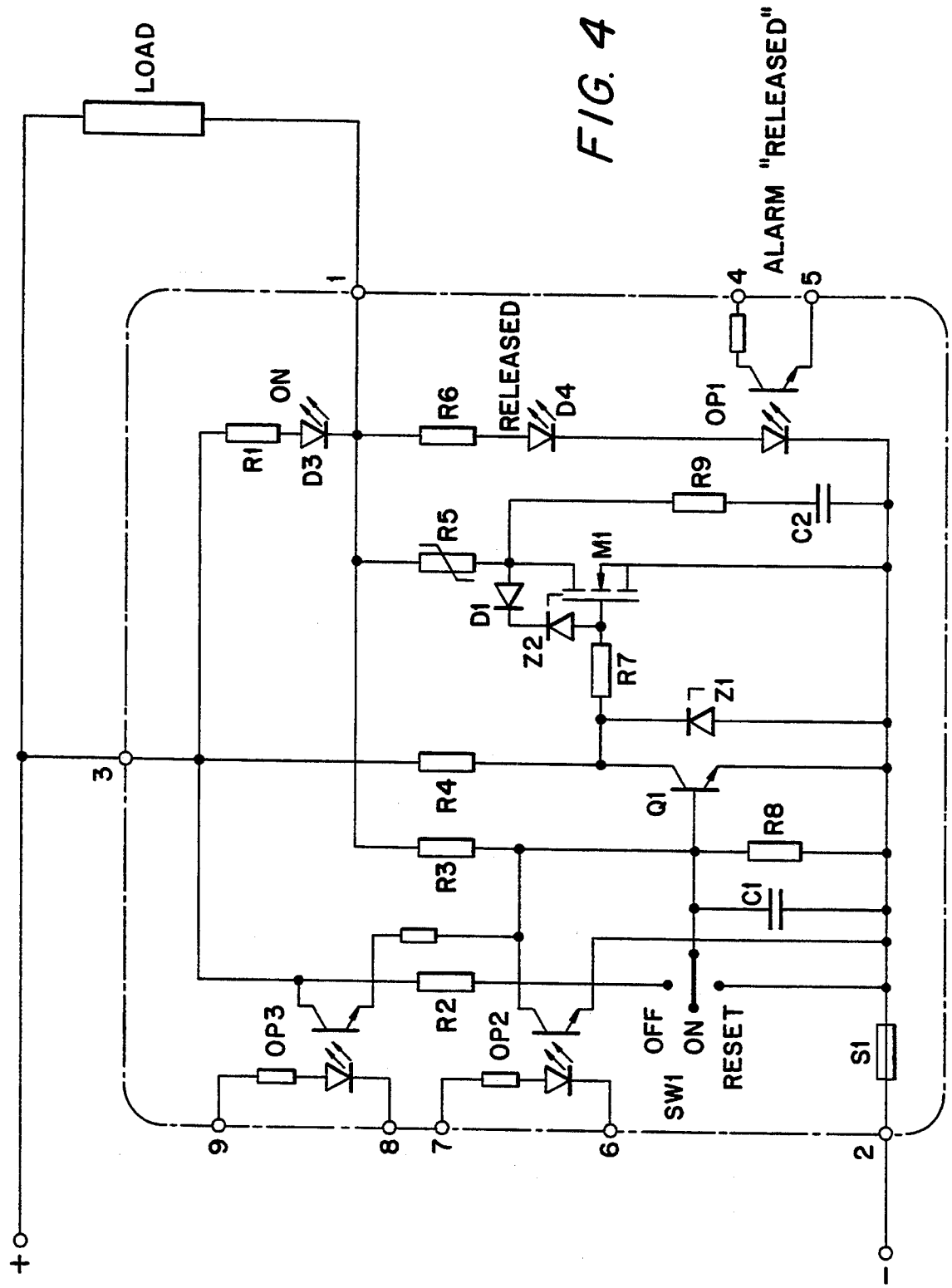
FIG. 4 is a circuit diagram of a fourth embodiment of an inventive short-circuit limiting device.

The circuit illustrated in FIG. 4 is an extension of the circuit illustrated in FIG. 3, where the circuit arrangement has been prepared for remote control with the aid of two further optoswitches OP2 and OP3 of a type corresponding to OP1. In this case, the emitter electrode of a phototransistor in the optoswitch OP3 is connected by means of a further resistor R12 to the collector electrode of a phototransistor in the optoswitch OP2 and also to the base connection on the transistor Q1. The current monitoring circuit can therewith be remote controlled with the aid of the two optoswitches, in addition to the direct control afforded by the switch SW1. When the optoswitch OP3 receives the supply voltage, so that its incorporated light-emitting diode will shine or radiate, the incorporated phototransistor opens and current is led-in on the base of the of the transistor Q1 via the additional resistor R12, and the base will then conduct current which, in turn, switches the field effect transistor to a non-conducting state, in accordance with the aforegoing. Thus, the same function is obtained as that when the switch S1 is switched to its OFF position. This enables the load L to be switched on and off by remote control.

Similarly, when the optoswitch OP2 receives a control voltage, its phototransistor will short-circuit the base electrode of the transistor Q1 to the negative supply connection in a corresponding manner, which corresponds to the function when the manual switch is switched to the RESET position. In other words, the circuit can be reset by remote control.

Figure 5:
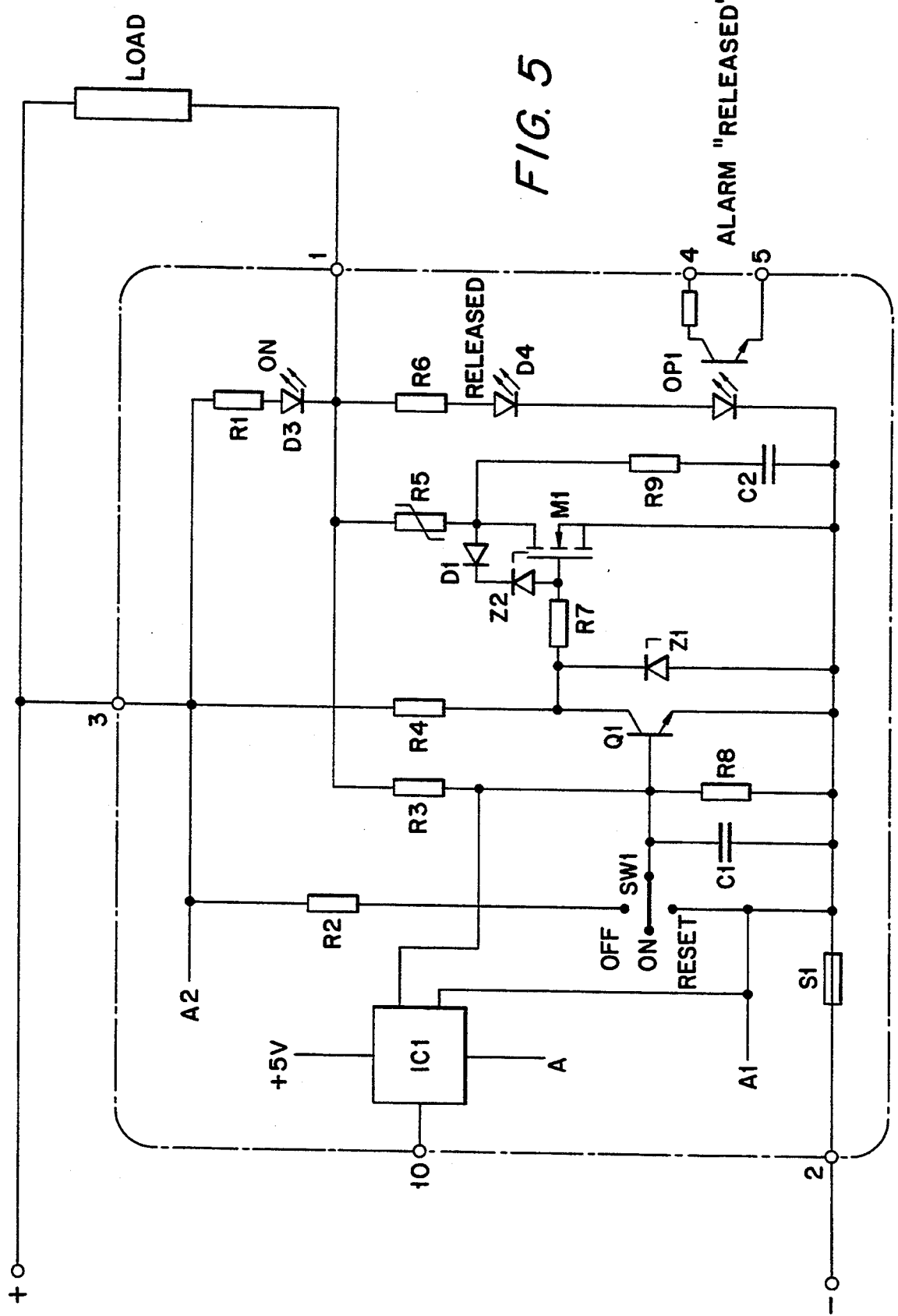
FIG. 5 is a circuit diagram of a fifth embodiment of an inventive short-circuit limiting device.

Finally, FIG. 5 illustrates an exemplifying embodiment in which the circuit according to FIG. 3 is provided with an integrated circuit IC1 instead of the optoswitches OP2 and OP3. In the case of this embodiment, the integrated circuit is comprised of a 5-volt logic circuit of the TTL type or the CMOS type, preferably with an output level having three states. A 74LS123 type IC-circuit is an example of a circuit which can be used conveniently in the illustrative embodiment. In this case, the output of the logic circuit is connected either to the minus supply in the case of the RESET function, and to the positive supply in the case of the OFF function, wherein the output will normally take its floating state when the circuit is in its ON function and therewith actively monitor the current through the load L. The integrated circuit IC1 is controlled in accordance with prior art techniques and enables the circuit to be readily applied in digital applications.

We claim:

1. An electronic short-circuit limiter having minimum power losses at nominal currents and including in the current path a MOS field effect transistor and a temperature-dependent resistor, said transistor being controlled by a detection circuit which diagnoses the short-circuiting current, wherein said current limiter uses a combined electronic and thermal feedback, since the temperature of the temperature-dependent resistor is also influenced by thermal energy emitted by said field effect transistor;

said temperature-dependent resistor being connected electrically in series to the collector electrode of said field effect transistor, the current to be monitored passing through said field effect transistor from its collector to its emitter;

said field effect transistor fully conducting in normal operating conditions, since the voltage on the gate of said transistor is maintained at a maximum high level with the aid of the resistor and a zener diodes;

the electric short-circuit current limiter further comprising:

a feedback loop which in addition to said temperature-dependent resistor forms a first voltage divider in series with a load:

a second voltage divider comprising two resistors and a second transistor, said second transistor being connected in parallel with said zener diode, which is thereby short-circuited by said second transistor when said second transistor begins to conduct current as a result of the potential on its base electrode exceeding a threshold value via said first and said second voltage divider when said second transistor begins to conduct; and said electronic short-circuit current limiter having two stable states, a first state in which the second transistor is essentially non-conducting and the field effect transistor is fully conducting, and a stable second state in which the second transistor is conducting and said field effect transistor is non-conducting, said current limiter not being able to occupy a stationary state within a linear working range of said field effect transistor.

2. The current limiter according to claim 1, wherein said temperature-dependent resistor has a pronounced non-linear characteristic, whereby the voltage drop over said resistor increases rapidly with increasing current and the voltage over said second voltage divider increases rapidly and said second transistor begins to conduct current, therewith causing said field effect transistor to switch to its non-conducting state.

3. The current limiter according to claim 2, wherein a capacitor is connected to the base electrode on said second transistor so as to provide a determined time constant before said transistor will begin to conduct in response to a voltage increase over said second voltage divider, the tripping of said field effect transistor being delayed by a time period corresponding to the RC-product of the time delay arrangement on the base electrode of said second transistor.

4. The current limiter according to claim 2 further, comprising a third voltage divider connected in parallel with said second voltage divider, a third transistor connected to the base electrode of the second transistor in parallel across said resistor of said second voltage divider, wherein the output of said third voltage divider together with a third capacitor is connected to the base electrode of said third transistor in order to automatically reset the current limiter after a time lapse determined by the RC-product of said third voltage divider and said third capacitor.

5. The current limiter according to claim 3 further, comprising a third voltage divider connected in parallel with said second voltage divider, a third transistor connected to the base electrode of said second transistor in parallel across said resistor of the second voltage divider, wherein the output of said third voltage divider together with a third capacitor is connected to the base electrode of said third transistor in order to automatically reset the current limiter after a time lapse determined by the RC-product of said third voltage divider and said third capacitor.

6. The current limiter according to claim 1, wherein the current limiter includes a single-pole switch having three switch positions, and wherein the base electrode on said second transistor can be temporarily connected to the emitter electrode of said second transistor via a first switch position so as to reset the current limiter, the base electrode can be connected to a voltage supply via a second switch position and via a resistor so as to maintain said second transistor continuously in a conducting state and the current limiter in its non-conducting state; said switch having a neutral position between said first and said second switch positions.

* * * * *